United States Patent [19]

Gupta et al.

[11] 4,362,895
[45] Dec. 7, 1982

[54] ULTRAVIOLET ABSORBING COPOLYMERS

[75] Inventors: Amitava Gupta, Pasadena; Andre H. Yavrouian, La Crescenta, both of Calif.

[73] Assignee: California Institute of Technology, Pasadena, Calif.

[21] Appl. No.: 303,969

[22] Filed: Sep. 21, 1981

Related U.S. Application Data

[62] Division of Ser. No. 126,580, Mar. 3, 1980, Pat. No. 4,310,650.

[51] Int. Cl.³ .................... H01L 31/04; B32B 27/30; C08F 216/02
[52] U.S. Cl. .................................... 136/256; 136/263; 428/36; 428/411; 428/334; 428/520; 428/522; 428/913
[58] Field of Search ............... 526/313; 428/522, 411, 428/334, 520, 913, 36; 136/256, 263

[56] References Cited

U.S. PATENT DOCUMENTS

| | | | |
|---|---|---|---|
| 2,962,533 | 11/1960 | Hardy et al. | 526/313 |
| 3,049,503 | 8/1962 | Milionis et al. | 526/313 |
| 3,107,199 | 10/1963 | Tocker | 526/313 |
| 3,113,907 | 10/1965 | Tocker | 526/313 |
| 3,133,042 | 5/1964 | Tocker | 526/313 |
| 3,173,893 | 3/1965 | Fertig et al. | 526/313 |
| 3,215,665 | 11/1965 | Sharetts et al. | 526/313 |
| 3,320,116 | 5/1967 | Tocker | 526/313 |
| 3,341,493 | 9/1967 | Goldberg et al. | 526/313 |
| 3,366,668 | 1/1968 | Strobel et al. | 526/313 |

*Primary Examiner*—Ellis P. Robinson
*Attorney, Agent, or Firm*—Marvin E. Jacobs

[57] ABSTRACT

Photostable and weather stable absorping copolymers have been prepared from acrylic esters such as methyl methacrylate containing 0.1 to 5% of an 2-hydroxyallyl benzophenone, preferably the 4,4' dimethoxy derivative thereof. The pendant benzophenone chromophores protect the acrylic backbone and when photoexcited do not degrade the ester side chain, nor abstract hydrogen from the backbone.

6 Claims, 3 Drawing Figures

ULTRAVIOLET ABSORBING COPOLYMERS

This is a division, of application Ser. No. 126,580, filed Mar. 3, 1980 now U.S. Pat. No. 4,310,650.

DESCRIPTION

TECHNICAL FIELD

The present invention relates to ultraviolet absorbing polymers, monomers therefor and, more particularly, to allyl hydroxy-benzophenones and to acrylic copolymers thereof.

It has been attempted to protect photodegradable polymers by incorporating various absorbers or stabilizers into the film, either as compounded additives dispersed in a film or as copolymerizable monomers. Additives are not weather stable. When the additive containing films are exposed for long periods to the environment, these fugitive agents migrate to the surface of the film and vaporize.

Benzophenones are a widely utilized class of U.V. screening agents. Vinyl derivatives of benzophenones have been copolymerized with hydrocarbon alpha-olefins such as styrene, ethylene or propylene. However, styrene polymers are intrinsically unstable to ultraviolet radiation and so much of the U.V. absorbing comonomer must be added that the mechanical properties of the copolymer are adversely affected. Furthermore, the benzophenone comonomers exhibit a very broad absorption band extending into the visible range reducing transparency and efficiency of underlying devices such as photovoltaic solar cells.

Copolymers of a commercially available U.V. absorbing monomer show poor absorption in the 300 to 350 nm range and a very broad absorption edge trailing into the visible at frequencies above about 400 nm. Acrylic ester polymers show are inherently stable to ultraviolet radiation so that a copolymer with a very small amount of 2-hydroxy benzophenone could be capable of forming thin U.V. screening films. However, the excited benzophenone moiety might readily transfer energy to the ester side chain since the triplet states of both are probably close enough in energy to permit endothermic energy transfer. Excitation of the acrylic ester side chain leads to C—O bond cleavage. Furthermore, the excited chromophore could also result in abstraction of hydrogen from the backbone. The excited chromophore may react with oxygen leading to photooxidation and consumption of the chromophore.

STATEMENT OF THE INVENTION

A copolymer of certain allyl benzophenones, addition copolymerizable with acrylic esters has been developed in accordance with this invention. The resulting copolymer has chemically bound chromophores which cannot be removed through physical processes. The acrylic backbone is protected by benzophenone moieties which when excited do not degrade the ester side chain nor abstract hydrogen from the backbone.

The copolymers can be cast into a thin, hard, weatherable, transparent film which exhibits strong absorption throughout the ultraviolet light range (295–400 mm) present in sunlight at ground level and a sharp slope at the visible end of the range. A 0.02 cm thick film of copolymer containing about 0.5% of the chromophore can achieve 99% attenuation of 360 mm radiation, but is essentially identical to the homopolymer acrylate in terms of structure and reactivity. Photodegradation experiments show the copolymer to be extremely photostable showing no indication of photooxidation, chain scission or photocrosslinking. A long term extraction in methanol showed no change in U.V. screening ability. The copolymers have high glass transition temperatures and molecular weights above 30,000 so that at room temperature, they are hard and dust resistant.

The copolymer of the invention can be applied as a film to protect substrates that are photodegraded by ground level solar radiation such as photovoltaic solar cells, solar reflectors, polyethylene or polypropylene pipes elastomers and the like. The films can be deposited on the surface of the substrates by extrusion, solvent casting or lamination.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1:
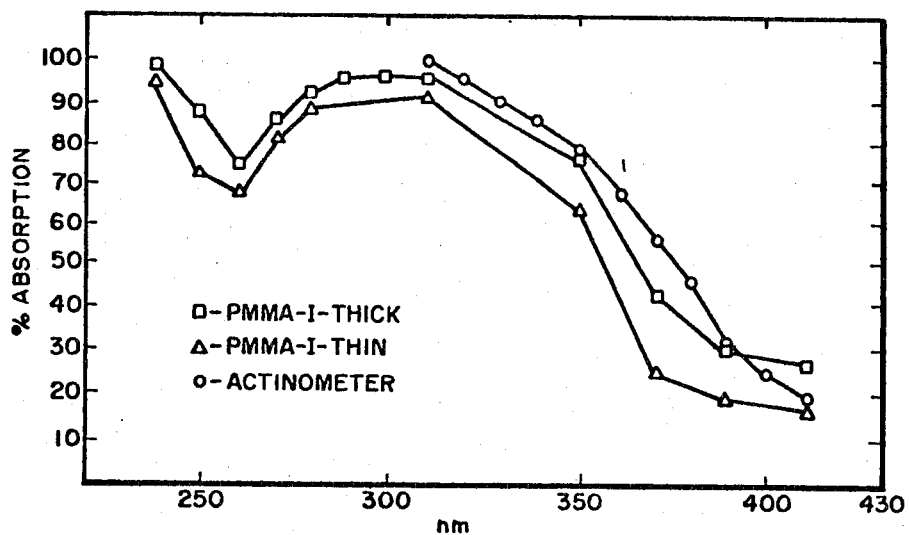
FIG. 1 is spectral response of o-nitrobenzaldehyde actinometer.

The copolymers of the invention comprises a copolymer of at least one acrylate ester of the formula:

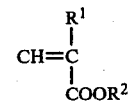

where $R^1$ is hydrogen or alkyl of 1 to 6 carbon atoms and $R^2$ is alkyl of 1 to 6 carbon atoms with 0.1 to 5% by weight of an allyl, 2-hydroxy benzophenone of the formula:

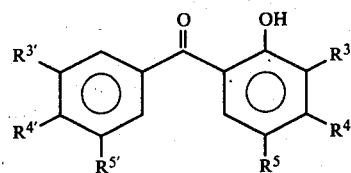

where Z is $-(CH_2)_m-CH=CH_2$ where m is 1 or 2 $R^3$, $R^4$, $R^5$, $R^{3'}$, $R^{4'}$ and $R^{5'}$ are individually selected from H, $OR^6$ or Z where $R^6$ is methyl, ethyl or propyl and at least one and no more than two of said $R^3$, $R^4$, $R^5$, $R^{3'}$, $R^{4'}$, $R^{5'}$ is Z. Preferably $R^3$ is Z, $R^{3'}$, $R^5$ and $R^{5'}$ are H and at least one of $R^4$ and $R^{4'}$ are alkoxy.

The closer spacing of the allyl group to the ring nucleus provides a more rigid, restricted linkage of the benzophenone to the acrylate backbone having less degree of freedom of movement. This provides improved absorption in the 300–350 nm range. The addition of methoxy groups, especially when in the position alpha to the allyl group provides a much sharper absorption edge at the higher frequencies and less trailing into the visible.

The polymer can be formulated with other compatible addition copolymerizable monomers such as diacrylates or triacrylates. The copolymer is formed by free radical initiated and catalyzed addition polymerization. The free radicals can be generated by heat, radiation or free radical catalysts such as peroxides, peroxy compounds or azo compounds. Since the benzophenone acts as a chain stopping polymerization inhibitor, the minimum concentration of initiator should be at least 0.5 part per hundred parts of total monomers, usually from 1 to 5 parts.

Copolymers were prepared by reaction of an excess of acrylic ester such as methyl methacrylate at a ratio of at least 5/1, preferably at least 10/1 with the allyl benzophenone in polar solvent, such as dioxane dimethyl sulfoxide (DMSO), dimethyl formamide (DMF) or their mixtures. The amount of monomers can be from 1 to 10% of the solution. The polymerization reaction is preferably conducted at an elevated temperature of from 35 degrees C. to 100 degrees C. followed by recovery and extraction of the polymer. Examples of practice follow:

EXAMPLE 1

Synthesis of 2,4-Dihydroxy-4'-Methoxy Benzophenone

Aluminum chloride (48 gm, 0.36 moles) was added gradually, with stirring to a mixture of 31 grams (0.18 moles) of anisoyl chloride, 19.82 grams (0.18 moles) of resorcinol and 300 ml. of dry nitrobenzene during 60 minutes. Sixty hours later the reaction mixture was poured on 200 grams of ice and 100 ml. of concentrated hydrochloric acid. After removal of the nitrobenzene with steam the residual crystalline solid product was washed with water and collected. The cake was then washed with cold ($-50$ degrees C.) methanol to remove tarry impurities and dried.

Yield: 37 grams (83.4% based on anisoyl chloride); M.P. $-154-156$ degrees C.; thin-layer chromatography on 13181-Silica gel in acetone showed essentially pure product.

EXAMPLE 2

Synthesis of 4,4'-Dimethoxy-2-Hydroxy Benzopheone

Methyl iodide (10.6 ml, 0.17 moles) was added portion-wise during a period of one hour to a solution of 37 grams (0.151 moles) of 2,4-dihydroxy-4'-methoxy benzophenone in 150 ml of boiling acetone, containing 62 grams (0.46 moles) of potassium carbonate. All starting materials were dried prior to use and the reaction was conducted under anhydrous conditions. After the addition was finished, the reaction mixture was heated under reflux for an additional 45 minutes. The product was isolated by pouring the mixture into 600 ml of water and filtration. The final product was washed several times with water and dried under vacuum.

Yield: 37 grams (95% of theory); M.P. $-114-116$ degrees C. The product gave an intense red-brown ferric chloride reaction in alcohol and was homogenous on TLC.

EXAMPLE 3

Synthesis of 2-Allyloxy-4,4-Dimethoxy Benzophenone

A mixture of 37 grams (0.143 moles) of 2-hydroxy-4,4'-dimethoxy benzophenone, 13.85 ml. (0.16 moles) of allyl bromide, 59 grams (0.429 moles) of dry, powdered potassium carbonate and sufficient dry acetone ($\sim$150 cc) to give an easily stirred mass was stirred and refluxed for six hours. Water (200 ml) was then added and the resultant oily mixture was extracted with three 75 ml portions of methylene chloride.

The combined organic phase extracts were washed with two 75 ml portions of 10% sodium hydroxide solution, twice with water, dried over anhydrous magnesium sulfate and distilled under reduced pressure to oil. The product gives a negative ferric chloride test, indicating absence of unreacted phenol and that etherification has occurred.

Yield: 38.3 grams (90% of theory) homogenous on TLC.

EXAMPLE 4

Synthesis of 2-Allyloxy-4-Methoxy-Benzophenone

The ether was prepared as in the preceding example from 100 grams (0.45 moles) benzophenone, 61 grams (0.45 moles) $K_2CO_3$, 2.5 grams (0.45 moles) allyl bromide and 200 ml of acetone. The product (pale yellow oil) was isolated after 8 hours reflux and was rearranged without further purification.

Yield: 81 grams (69% of theory) Homogenous on TLC; negative ferric chloride test.

EXAMPLE 5

Synthesis of 3-Allyl-4,4'-Dimethoxy-2-Hydroxy-Benzophenone

Thirty-seven grams of 2-allyloxy-4,4'-dimethoxybenzophenone were placed in thin-walled pyrex tube, equipped with air-condenser, magnetic stirring, nitrogen inlet and thermometer. With stirring and under nitrogen, the product in the tube was placed in an oil-bath at 240 degrees C. After two minutes a sudden temperature surge to 295 degrees C. occurred and heating was discontinued. The reaction mixture was cooled to room temperature and an equal volume of methanol was added. The mixture was cooled to $-20$ degrees C., upon which yellow crystalline product was obtained. The product was recrystallized from methanol/acetone, yielding homogenous product of TLC (10% acetone in petroleum ether). The material gives a positive test with ferric chloride indicating that rearrangement has occurred.

Yield: 22 grams (60% of theory); M.P.$=119-120$ degrees C. calculated for $C_{18} H_{18} O_4$ (298.32); C, 72.46%; Found: C, 72.56%; H, 6.26%.

The ultraviolet spectrum of the product exhibits $\lambda$ max at 300 nm with an extinction coefficient of 20,855 in ethyl alcohol.

EXAMPLE 6

Methyl Methacrylate 3-Allyl-4,4'-Dimethoxy-2-Hydroxy-Benzophenone Copolymer

A 250 ml., three-necked flask equipped with nitrogen inlet, condender, thermometer, and a magnetic stirrer was charged with a solution of 0.5 grams of 3-allyl-4,4'-dimethoxy-2-hydroxy-benzophenone, 5 grams of freshly distilled methyl methacrylate and 0.1 grams of $\alpha,\alpha'$-azobisisobutyronitrile in 100 ml of dimethyl sulfoxide/dioxane (1:9). All starting materials and solvents were dried prior to use. The reaction vessel was flushed with dry nitrogen for 10-15 minutes and then placed in a constant temperature water bath at 55 degrees C. for 12 hours, then was raised to 80 degrees C., and maintained at that temperature for an additional 24 hours.

The contents of the flask were then slowly poured into a waring blender, containing 500 ml of methanol. The product was collected by filtration, washed with two-50 ml portions of methanol, and dried in vacuo at 40 degrees C. The crude polymer was dissolved in methylene chloride, the solution was filtered and the filtrate added to a large excess of methanol as described above. The polymer was further purified by exhaustive extraction with methanol in a soxhlet extraction apparatus for 100 hours. Small samples of the polymer were taken out, dissolved in methylene chloride and their UV-spectrum taken. The polymer extraction continued until a constant UV-absorbance was obtained at 320 mm. The product contains 0.43% of the 2-hydroxy-benzophenone UV-absorber as copolymer, and no other change in this concentration was observed after the 40th hour of extraction. The final product was dried in vacuo at 40 degrees C. to yield 4.95 grams of copolymer. The gel-permeation chromatography curve indicates that homogenous copolymer with $\overline{M}_w = 83,000$ has been produced. A Waters associates, Model 6000 gel permeation chromatograph, packed with a bank of four styragel columns and standardized with commercial monodisperse polystyrene fractions was used to obtain the GPC curves. The ultraviolet spectrum of the materials exhibits $\lambda$ max at 304 nm (a=0.264) in methylene chloride.

EXAMPLE 7

Methyl Methacrylate
3-Allyl-4,4'-Dimethoxy-2-Hydroxy-Benzophenone Copolymer

The procedure of Example 6 was repeated substituting Permasorb MA for the allyl-hydroxy-benzophenone. A copolymer was produced.

A solution of the copolymer of Example 6 in $CH_2Cl_2$ was analyzed on a HPLC using four capillary columns packed with "$\mu$-styragel." The refractive index peak matched with the UV (250 nm) peak indicating that the chains containing the chromophores had the same approximate distribution as the chains with no chromophores. However, the UV peak have a lower apparent molecular weight distribution than the refractive index peak indicating that the chromophore bearing chains had a lower molecular weight distribution. By following these two distributions simultaneously, it is possible to identify the site of photodegradation in the copolymer. Since incorporation is only about 0.5%, the probability of one chain containing more than one chromophore is quite small assuming random copolymerization. Hence, the copolymer is almost identical to PMMA in terms of structure and reactivity and is not separated from it either by extraction or by passage through HPLC. It is not expected that blocks of allyl benzophenone will form since it is expected that a chain radical ending in allyl benzophenone will decay mainly through recombination, probably with a chain radical with methyl methacrylate at the end ($R·_2$) or with the initiator radical ($P·$), since concentration of $R_2·$ or $P·$ are expected to be much higher than $R_1·$. In a sense, the allyl benzophenone acts as a polymerization inhibitor making the minimum concentration of initiator needed very high. It is expected that much of the low molecular weight product containing high concentration of initiator end groups (which may be potentially photolabile) is removed through extraction. The copolymer was dissolved in $CH_2Cl_2$ and cast into optically clear films which were dried to remove solvent. These films were irradiated in a merry-go-round type apparatus with light from a medium pressure Hg (Hanovia) lamp filtered through 8 mm of pyrex, which attenuates 99% of the light incident on it at 297 nm. The spectral distribution of this irradiance has been measured and consists of peaks at 302, 313, 366 nm in the ultraviolet region which are absorbed by the sample. Since the objective was to evaluate the photo stability of these films in sunlight at ground level (Airmass one), it was decided to use a broadband ultraviolet source as described above without further wavelength selection. Test films of two thickness were used, $4 \times 10^{-3}$ cm and $2 \times 10^{-3}$ cm approximately. The light flux absorbed by the sample integrated in time was estimated by using an actinometer film containing o-nitrobenzaldehyde which has approximately the same wavelength response as the test films (FIG. 1). Light flux absorbed by the films was calculated by choosing an actinometer film of approximately equal wavelength response and calculating conversion in milligrams of o-nitrobenzaldehyde to o-nitrosobenzoic acid per second. If this is a, then number of photons absorbed by the test film per second is $(a/251) \times 10^{-3} \times 2.0 \times 6 \times 10^{23}$, when 151 is the molecular weight of O-nitrobenzaldehyde, 2.0 is the reciprocal of quantum yield of conversion in the actiometer and $6.0 \times 10^{23}$ is Avogadro's number. This value was compared with energy of radiation absorbed per unit time obtained from spectroradiometric measurements on the lamp and absorbance plot of the actinometer film. Table 1 gives the number of photons absorbed by the actinometer film estimated radiometrically and compares with the experimental quantity. In this table, the number of photons absorbed by the copolymer films is also included.

| Film Thickness ($\times 10^{-3}$ cm) | Time of Exposure (hrs) | No. of photons Absorbed ($\times 10^{20}$) per $cm^2$ |
|---|---|---|
| 2 | 0 | — |
| 4 | 7 | 21.7 |
| 4 | 16 | 49.6 |
| 2 | 77 | 215.6 |
| 2 | 135 | 338 |
| 4 | 448 | 1388.8 |

The following table gives the total dosages and times of irradiation of the films.

| Wavelength Range | Actinometer Absorption Photons/ $cm^2$ sec | Film (d = $4 \times 10^{-3}$cm) Absorption Photons/ $cm^2$ sec | Film (d = $2 \times 10^{-3}$cm) Absorption Photons/ $cm^2$ sec |
|---|---|---|---|
| $\leq$293 nm | $2.4 \times 10^{13}$ | $9.1 \times 10^{13}$ | $8.9 \times 10^{13}$ |
| 293–299.6 | $8.9 \times 10^{13}$ | $3.3 \times 10^{14}$ | $3.3 \times 10^{14}$ |
| 299.6–307.8 | $1.0 \times 10^{15}$ | $4.0 \times 10^{15}$ | $3.9 \times 10^{15}$ |
| 307.8–323.5 | $7.0 \times 10^{14}$ | $2.8 \times 10^{15}$ | $2.6 \times 10^{15}$ |
| 323.5–350 | $1.7 \times 10^{16}$ | $6.3 \times 10^{16}$ | $6.1 \times 10^{16}$ |
| 350–385.3 | $5.0 \times 10^{15}$ | $1.9 \times 10^{15}$ | $1.2 \times 10^{16}$ |
| Total Absorption | $2.38 \times 10^{16}$ | $8.9 \times 10^{16}$ | $7.9 \times 10^{16}$ |
| Overall Absorption from Chemical Conversion | $2.2 \times 10^{16}$ | | |

In terms of AM-1 sunlight, the largest period of exposure corresponds to an outdoor exposure of 1.5 yrs. The films were monitored by UV-visible spectroscopy and FT-IR spectroscopy as well as HPLC equipped with capillary columns packed with μ-styragel. A preliminary experiment indicated negligible weight loss on irradiation.

Figure 2:
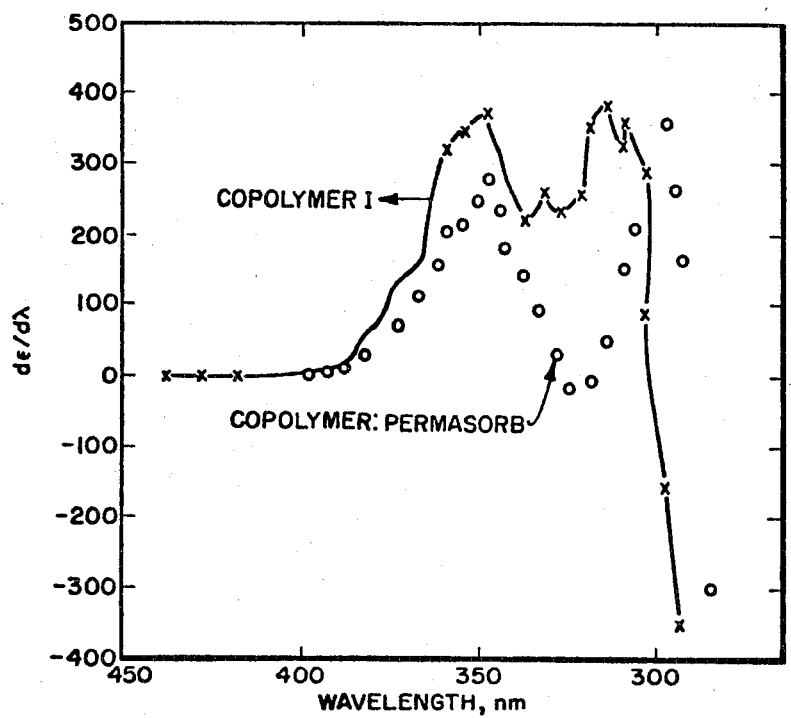
FIG. 2 is rate of change of absorptance vs. wavelength for copolymers of Examples 6 and 7.
Figure 3:
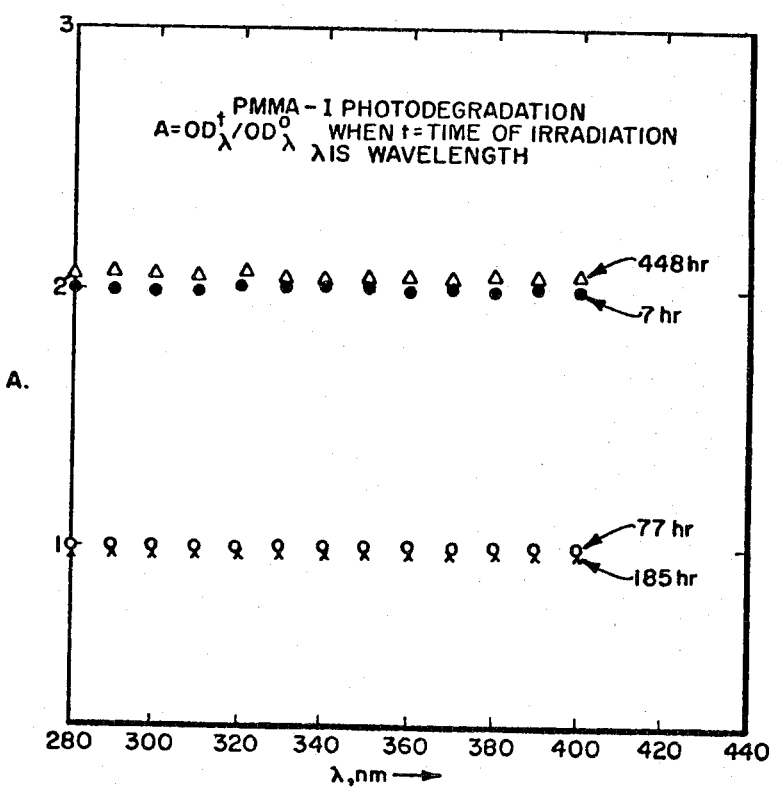
FIG. 3 is change of electronic spectra of copolymer films as a function of irradiation period.

FIG. 2 shows a plot of dε/dλ vs wavelength for the copolymer of Examples 6 and 7. dε/dλ is taken as screening efficiency since it is a measure of effectiveness of screening at short wavelength (300–360 nm) without imparting color to the film or absorbance at wavelengths greater than 400 nm. FIG. 3 is a plot of A vs wavelength when $A = OD_\lambda{}^t / OD_\lambda{}^o$ when t is time of exposure. This plot indicates that there is negligible change in structure of the chromophore due to photodegradation at the two film thicknesses studied. FT-IR spectra yields the same results, in other words, spectroscopic results indicate little change in the structure of the chromophore. A plot of difference hydroxyl absorption at 3580 cm$^{-1}$ vs time of exposure was prepared. The hydroxyl band is broad and cannot be precisely analyzed. The concentration is quite small, but it would still be sufficient to cause a measurable change in the electronic absorption spectrum if it represented consumption of the chromophore. Hence, it is assigned to the MMA segments of the polymer and a slow process of photo oxidation catalyzed by the chromophore cannot be ruled out. Methanol is ruled out since no methanol is found in HPLC analysis performed on the same films. Absence of methanol also excludes excitation transfer to the side chain (ester). Table 3 gives molecular weight distributions calculated from both refraction index and UV peaks.

TABLE 3

| Molecular weight distributions as function of exposure period. | | | | |
|---|---|---|---|---|
| Detection Mode | Time of Exposure (hr) | $\overline{M}_n$ | $\overline{M}_w$ | $\overline{M}_w/\overline{M}_n$ |
| RI | 0 | 46000 | 87000 | 1.89 |
| UV | 0 | 31000 | 69000 | 2.21 |
| RI | 448 | 42000 | 77000 | 1.83 |
| UV | 448 | 34000 | 79000 | 2.36 |

Quantum yield of chain scission calculated from refraction index measurements yield a value of $1.8 \times 10^{-8}$ for quantum yield of chain scission, assuming that $M_{nt}/M_{no} - 1) C_s = \phi c - s - \times P_t$ when $\phi c - s$ is quantum yield of chain scission, $P_t$ is the number of moles of photons absorbed in time and Cs is the number of moles of chains present in the films.

This exceedingly small value is an indication of the extreme photostability of the polymer. There is a simultaneous increase of the molecular weight of the chains bearing chromophores which generate the UV signals. A simple calculation indicates that the probability of a chain containing one or more chromophores in this system is about 66%, assuming random copolymerization. Hence, using the UV data of Table 2 it is possible to calculate the quantum yield of branching here for the chains bearing chromophore units. This quantum yield is approximately $1.6 \times 10^{-8}$. Consideration of the data that the electronic absorption spectrum remains constant (to within 2%) and the chromophore bearing chains undergo branching while the copolymer as a whole undergoes a net decrease in molecular weight. A photochemical mechanism has been developed which identifies the tertiary hydrogens on the chromophore bearing chains as the primary site of attack. The total concentration of tertiary hydrogens in the copolymer per sq cm is about $4.2 \times 10^{-8}$ moles in 1 sq cm of film. After 448 hours of irradiation the number of moles of branch points generated is about $4.8 \times 10^{-9}$ moles/sq cm, and the net number of chain scissions is about $6 \times 10^{-9}$ moles/sq cm of the film.

Transient absorption spectra were taken after various time delays following flash photolysis excitation with a 355 nm pulse. The lifetime of the shortlived transient is estimated to be ~10 ps, while the lifetime of the long-lived transient is estimated to be >400 ps. The short-lived transient is presumably the first singlet, while the long-lived transient is the first triplet. The triplet lifetime is extraordinarily short relative to that of triplet benzophenone and is clearly due to the intramolecular hydrogen bonding. This exceedingly short triplet lifetime also explains the photostability of this system. Both hydrogen abstraction and energy transfer processes leading to degradation are expected to be activated and hence, far less efficient compared with the ultra fast radiationless deactivation process which efficiently depopulates the triplet.

Thus, a stable copolymer containing a 2-hydroxy benzophenone derivative as a pendant group has been prepared. The stability of the copolymer is clearly due to the short lifetime of the reactive excited states of the chromophore. Copolymers prepared according to this invention are useful as transparent U.V. screening covering or encapsulating films. Copolymers of improved physical properties can be prepared by substitution of a portion of methyl methacrylate with other monomers such as n-butyl methacrylate.

It is to be realized that only exemplary and preferred embodiments of the invention hae been described and that these and many other alternative, variations, adaptations and modifications are permissible without departing from the spirit and scope of the invention as defined in the following claims.

We claim:
1. A coated article comprising a photolabile substrate containing a coating of an addition polymerized copolymer of a monomer mixture comprising:
an acrylic ester of the formula:

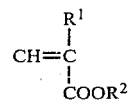

where $R^1$ is hydrogen, alkyl of 1 to 6 carbon atoms and $R^2$ is alkyl of 1 to 6 carbon atoms; and
0.1 to 5% of hydroxy-benzophenone of the formula

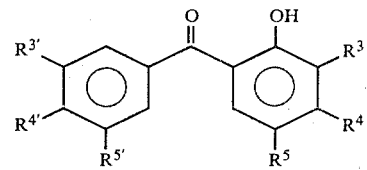

where $R^3$, $R^4$, $R^5$, $R^{3'}$, $R^{4'}$, $R^{5'}$ are individually selected from H, $OR^6$ or Z where $R^6$ is methyl, ethyl or propyl and Z is $-(CH_2)_m - CH = CH_2$ where m is 1 or 2 and at least one but no more than two of $R^3$, $R^4$, $R^5$, $R^{3'}$, $R^{4'}$ or $R^{5'}$ are Z.

2. An article according to claim 1 in which the coating has a thickness from 1 mm to 1 cm.

3. A coated article according to claim 1 in which the substrate is a photovoltaic cell.

4. A copolymer according to claim 1 in which $R^1$ and $R^2$ are methyl.

5. A copolymer according to claim 1 in which $R^3$ is Z and at least one of $R^4$ and $R^{4'}$ are alkoxy.

6. A copolymer according to claim 5 in which $R^{3'}$, $R^5$ and $R^{5'}$ are H, and $R^4$ and $R^{4'}$ are both methoxy and m is 1.

* * * * *